United States Patent
Lou et al.

(10) Patent No.: US 9,583,512 B2
(45) Date of Patent: Feb. 28, 2017

(54) ARRAY SUBSTRATE AND MANUFACTURING METHOD THEREOF, AND DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Junhui Lou, Shanghai (CN); Hua Gong, Shanghai (CN); Junchao Ma, Shanghai (CN); Yong Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/712,188

(22) Filed: May 14, 2015

(65) Prior Publication Data
US 2016/0181280 A1 Jun. 23, 2016

(30) Foreign Application Priority Data
Dec. 23, 2014 (CN) .......................... 2014 1 0831424

(51) Int. Cl.
| | | |
|---|---|---|
| H01L 27/14 | (2006.01) |
| H01L 29/04 | (2006.01) |
| H01L 29/15 | (2006.01) |
| H01L 27/12 | (2006.01) |
| G02F 1/1362 | (2006.01) |
| H01L 29/786 | (2006.01) |
| G02F 1/1345 | (2006.01) |

(52) U.S. Cl.
CPC ......... *H01L 27/124* (2013.01); *G02F 1/13454* (2013.01); *G02F 1/136286* (2013.01); *H01L 27/1222* (2013.01); *H01L 27/1225* (2013.01); *H01L 27/1248* (2013.01); *H01L 27/1262* (2013.01); *H01L 29/78636* (2013.01); *G02F 2001/13456* (2013.01)

(58) Field of Classification Search
CPC ........................... H01L 27/124; H01L 27/1248
USPC ....... 257/43, 72, E27.111, E27.119, E27.121
See application file for complete search history.

(56) References Cited

U.S. PATENT DOCUMENTS

2004/0109098 A1   6/2004  Kim et al.
2006/0102905 A1*  5/2006  Park .................. G02F 1/133512
                                            257/72

(Continued)

*Primary Examiner* — Robert Huber
(74) *Attorney, Agent, or Firm* — Faegre Baker Daniels LLP

(57) ABSTRACT

The disclosure relates to an array substrate and a manufacturing method thereof, and a display panel. The array substrate includes a plurality of data lines and a plurality of first gate lines, a plurality of first pixel units and a plurality of second pixel units; a plurality of second gate lines; a first TFT and a second TFT, where a first electrode of the first TFT is disposed at one side of the second gate line, the gate and the second electrode of the first TFT is disposed at the other side of the second gate line, the gate, the first electrode, the second electrode and the active layer of each second TFT are disposed at the same side of the second gate line, where the first electrodes of the first TFT and the second TFT are electrically connected to the date lines respectively.

19 Claims, 9 Drawing Sheets

(56) References Cited

U.S. PATENT DOCUMENTS

| | | | |
|---|---|---|---|
| 2010/0225859 A1* | 9/2010 | Tsai | G02F 1/136213 |
| | | | 349/106 |
| 2015/0236043 A1* | 8/2015 | Shi | H01L 27/1259 |
| | | | 257/390 |
| 2015/0309380 A1* | 10/2015 | Xu | G02F 1/1362 |
| | | | 257/300 |

* cited by examiner

--Prior Art--

--Prior Art--

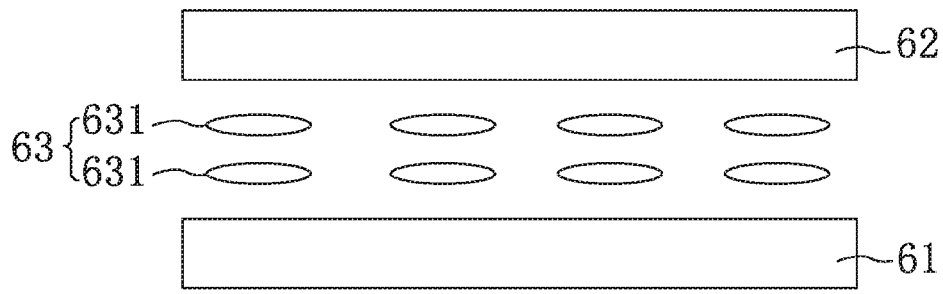

FIG. 8

```
Forming a plurality of data lines and a plurality of first gate lines,
wherein, a plurality of first pixel units and a plurality of second pixel      ~71
units are formed by intersecting the data lines with the first gate lines
```

```
Forming a plurality of second gate lines parallel to the data lines,
wherein, different second gate lines are electrically connected to           ~72
different first gate lines respectively
```

```
Forming a first TFT in a first pixel unit and forming a second TFT in a
second pixel unit, wherein, the first TFT and the second TFT
comprises a gate, a drain electrode, a source electrode and an active
layer; a metal layer of the source electrode and the drain electrode are
in the same layer as the second gate lines and the data lines, and the       73
source electrode of the first TFT is disposed at one side of the second
gate line; the gate line and the drain electrode of the first TFT are
disposed at the other side of the second gate line, the second gate line
is partly overlapped with the active layer of the first TFT; the gate line,
the source electrode, the drain electrode and the active layer are
formed at the same side of the second gate lines, where, the source
electrodes of the first TFT and the second TFT are electrically
connected to the data lines nearing to each source electrode
respectively
```

FIG. 9

ARRAY SUBSTRATE AND MANUFACTURING METHOD THEREOF, AND DISPLAY PANEL

CROSS-REFERENCE TO RELATED APPLICATION

This application claims priority to Chinese Application No. 201410831424.2, filed Dec. 23, 2014, which is herein incorporated by reference in its entirety.

TECHNICAL FIELD

This disclosure is related to display devices and, in particular, to array substrates and methods of manufacturing the array substrates.

BACKGROUND

With the development of display technologies, a liquid crystal display panel has been widely used, and a display effect of the display panel has been continuously improved.

In the related art, a dot inversion effect is implemented in a column inversion manner in an array substrate of a zig-zag structure, thereby reducing power consumption of the array substrate in displaying. FIG. 1A is a schematic diagram showing a structure of an array substrate having the zig-zag structure in the related art. As shown in FIG. 1A, the array substrate includes a plurality of data lines 11, a plurality of gate lines 12 and a plurality of pixel units 13 defined by intersecting the data lines 11 with the gate lines 12, where the data lines 11 are electrically insulated from the gate lines 12, and each pixel unit 13 includes a Thin Film Transistor (TFT) 131 and a pixel electrode 132 electrically connected to the TFT 131. Further, each one of the TFTs 131 in a first row is electrically connected to an adjacent data line 11 at the left side of the TFT 131, each one of the TFTs 131 in a second row is electrically connected to an adjacent data line 11 at the right side of the TFT 131, each one of the TFT 131 in a third row is electrically connected to an adjacent data line 11 at a left side of the TFT 131, and so on. That is, the TFTs 131 in odd-numbered rows are electrically connected to the adjacent data lines 11 at left sides of the TFTs 131, and the TFTs 131 in even-numbered rows are electrically connected to the adjacent data lines 11 at right sides of the TFTs 131, thus such electrical connections between the TFTs 131 and the data lines 11 implement the zig-zag structure.

A symbol "+" in FIG. 1A indicates a positive polarity of a data signal, while a symbol "−" in FIG. 1A indicates a negative polarity of the data signal, where the polarity of the data signal depends on a voltage difference between a voltage of the data signal and a common voltage. If the voltage difference is larger than 0, the polarity of the data signal is positive, otherwise, the polarity of the data signal is negative. A dot inversion effect is implemented by means of column inversion in the array substrate having the zig-zag structure as shown in FIG. 1A, as can be seen from the polarity of the data signal applied to each data line 11 and the polarity of the data signal received by each pixel electrode 132 as shown in FIG. 1A.

BRIEF DESCRIPTION OF THE DRAWINGS

With the detailed non-limiting embodiments described below with reference to accompanying drawings, other features, purposes and advantages of the present disclosure will become more apparent.

FIG. 8 is a schematic diagram showing a structure of a display panel, according to embodiments of the disclosure; and FIG. 9 is a flowchart diagram of a manufacturing method for an array substrate, according to embodiments of the disclosure.

Figure 1A:
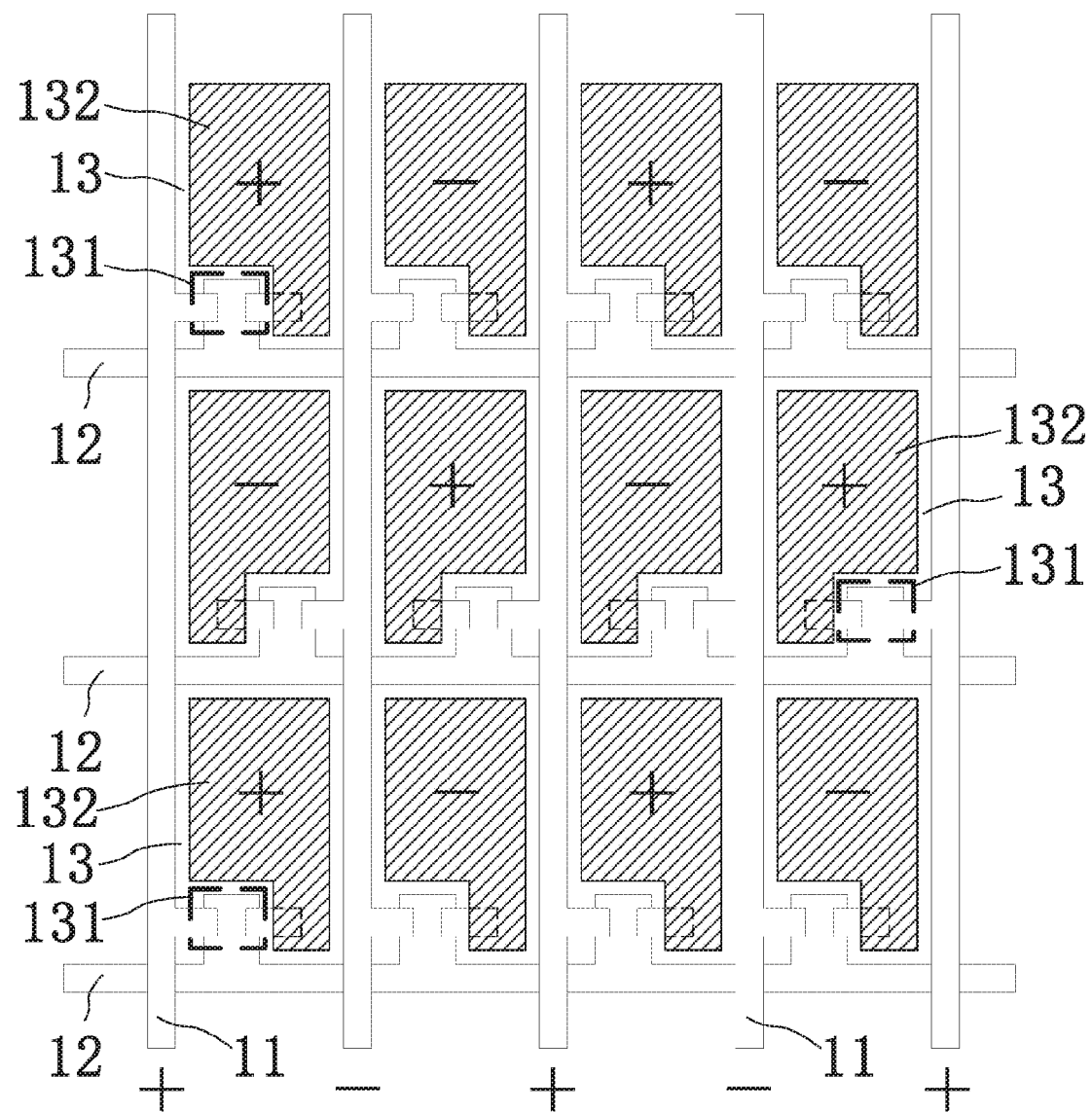
FIG. 1A is a schematic diagram showing a structure of an array substrate having a zig-zag structure in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The present disclosure will be described below further in detail with reference to the accompanying drawings and the embodiments. It is appreciated that the specific embodiments described herein are merely used to explain the present disclosure, rather than limiting the present disclosure. It is further noted that, to facilitate the description, merely a part not the whole of content is shown in the accompanying drawings, the part is related to the present disclosure.

A gate drive circuit disposed in a frame area of the display panel occupies a large area in the frame area. In order to reduce the frame area in the display panel, the gate drive circuit may be disposed in a step-shaped area of the display panel. However, additional wires are required to be disposed in a display area of the display panel to send scanning signals generated by the gate drive circuit to the gate lines.

Figure 1B:
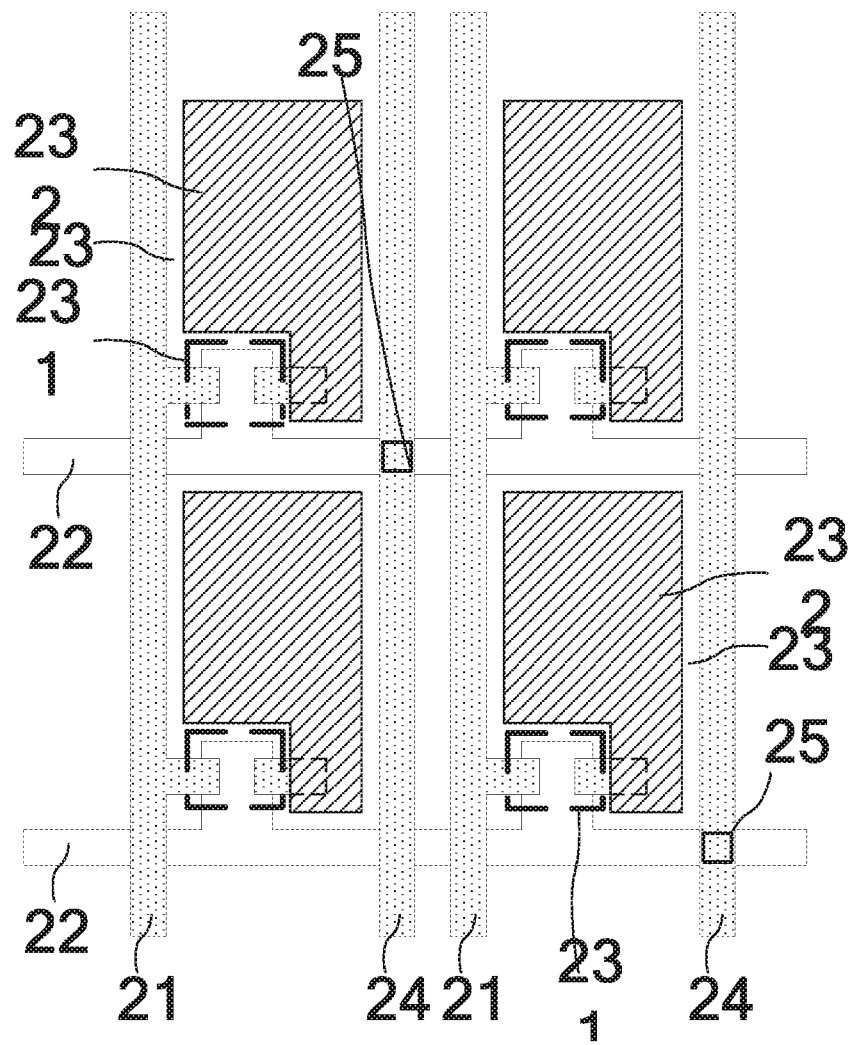
FIG. 1B is a schematic diagram showing a structure of an array substrate without frame.

FIG. 1B is a schematic diagram showing a structure of an array substrate without any frame area. As shown in FIG. 1B, the array substrate includes a plurality of data lines 21, a plurality of first gate lines 24 disposed in parallel with the data lines 21, a plurality of second gate lines 22 and a plurality of pixel units 23 formed by intersecting the data lines 21 with the second gate lines 22, where the data lines 21 are electrically insulated from the second gate lines 22, and each pixel unit 23 includes a TFT 231 and a pixel electrode 232 electrically connected to the TFT 231. As illustrated in FIG. 1B, the first gate lines 24, the data lines 21, as well as sources and drains of the TFTs 231 are disposed in the same layer, and each first gate line 24 is electrically connected to merely one second gate line 22 via a via hole 25.

As illustrated in FIG. 1B, all of the TFTs 231 are electrically connected to the adjacent data lines 21 at the left sides of the TFTs 231, respectively. In order to implement the zig-zag structure, the TFTs 231 in the odd-numbered rows or the even-numbered rows are required to be electrically connected to the adjacent data lines 21 at the right sides of the TFTs 231. However, the first gate line 24 is disposed between the TFT 231 and the data line 21 at the right side of the TFT 231, and the source of the TFT 231 is disposed in the same layer as the first gate 24, the TFTs in the odd-numbered rows or the even-numbered rows cannot be electrically connected to the data lines 21 at right sides of the TFTs 231, thereby the array substrate without frame cannot employ the zig-zag structure.

Figure 2:
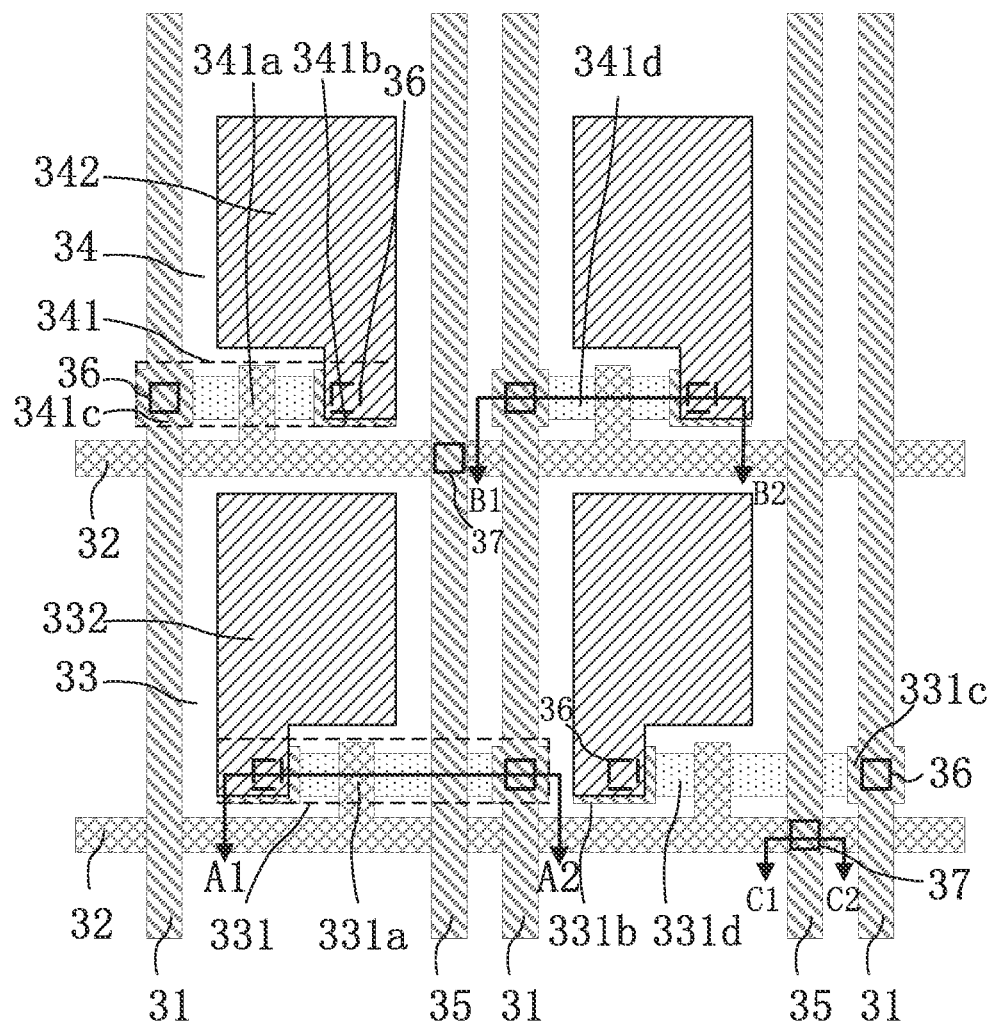
FIG. 2 is a schematic diagram showing a structure of an array substrate, according to embodiments of the disclosure.

Embodiments of the disclosure provide an array substrate. FIG. 2 is a schematic diagram showing a structure of an array substrate, according to embodiments of the disclosure. As shown in FIG. 2, the array substrate includes a plurality of data lines 31, a plurality of first gate lines 32, a plurality of first pixel units 33 and a plurality of second pixel units 34 both formed by intersecting the plurality of data lines 31 with the plurality of first gate lines 32 which are electrically insulated from the data lines 31; and a plurality of second gate lines 35 disposed parallel to the data lines 31, where the second gate lines 35 are electrically connected to the first gate lines 32, respectively, a first TFT 331 is disposed in each one of the first pixel units 33, and a second TFT 341 is disposed in each one of the second pixel units 34. The first TFT 331 and the second TFT 341 each include a gate (e.g. a gate 331a of the first TFT 331 and a gate 341a of the second TFT 341 as shown in FIG. 2), a second electrode (e.g. a second electrode 331b of the first TFT 331 and a second electrode 341b of the second TFTs 341 as shown in FIG. 2), a first electrode (e.g. a first electrode 331c of the first TFT 331 and a first electrode 341c of the second TFT 341 as shown in FIG. 2) and an active layer (e.g. an active layer 331d of the first TFT 331 and an active layer 341d of the second TFT 341 as shown in FIG. 2). The second gate lines 35 and the data lines 31 are disposed in the same layer as a metal layer in which the first electrode and the second electrode are disposed. As shown, elements represented by the same pattern are disposed in the same layer. The first electrode 331c of the first TFT 331 is disposed at one side of the second gate line 35, and the second electrode 331b and the gate 331a of the first TFT 331 are disposed at the other side of the second gate line 35. A projection of the second gate line 35 on the active layer 331d is partly overlapped with the active layer 331d of the first TFT 331. The gate 341a, the first electrode 341c, the second electrode 341b and the active layer 341d of the second TFT 341 are disposed at the same side of the second gate lines 35, where each one of the first electrodes of the first TFT 331 and the second TFT 341 is electrically connected to the data line 31 adjacent thereto.

It is noted that in the TFTs (including the first TFT 331 and the second TFT 341) of the array substrate, if the first electrode is a source, the second electrode is a drain, otherwise, if the first electrode is the drain, the second electrode is the source. In the actual manufacture of the array substrate, the first electrode and the second electrode of the TFT can be determined depending on actual technologic processes, which are not limited here.

The case that the second gate lines 35 are electrically connected to the first gate lines 32, respectively, means that: any second gate line 35 is electrically connected to only one first gate line 32 and provides the first gate line 32 with a scan signal. The array substrate provided according to embodiments of the disclosure may be an array substrate without frame.

In addition, as shown in FIG. 2, the second electrode 331b and the first electrode 331c of the first TFT 331 are electrically connected to the active layer 331d of the first TFT 331 via a first via hole 36; the second electrode 341b and the first electrode 341c of the second TFT 341 are electrically connected to the active layer 341d of the second TFT 341 via a first via hole 36; the second gate line 35 is electrically connected to the first gate line 32 via a second via hole 37; the second electrode 331b of each one of the first TFTs 331 is electrically connected to a first pixel electrode 332 within the first pixel unit 23 in which the first TFT 331 is disposed; and the second electrode 341b of each one of the second TFTs 341 is electrically connected to a second pixel electrode 342 within the second pixel unit 24 in which the second TFT 341 is disposed.

As such, the first electrode 331c of the first TFT 331 is disposed at one side of the second gate line 35 while the second electrode 331b and the gate 331a of the first TFT 331 are disposed at the other side of the second gate line 35, the gate 341a, the first electrode 341c, the second electrode 341b and the active layer 341d of the second TFT 341 are disposed at the same side of the second gate line 35, and each of the first electrodes of the first TFT 331 and the second TFT 341 are electrically connected to the data line 31 adjacent thereto. Therefore, if the second gate line 35 is disposed between a TFT and the data line 31 electrically connected to the first electrode of the TFT, the TFT may be embodied as the first TFT 331, so that the first electrode 331c of the first TFT 331 may be electrically connected to the data line 31 even if the second gate line 35 and the data line 31 are disposed in the same layer as the metal layer in which the first electrode and the second electrode are disposed. Further, if there is no second gate line 35 disposed between a TFT and the data line 31 electrically connected to the first electrode of the TFT, the TFT may be embodied as a second TFT 341, so that the first electrode 341c of the second TFT 341 may be electrically connected to a corresponding data lines 31 directly. As a result, in the above array substrate without frame, TFTs (e.g. the second TFTs) in odd-numbered rows (or even-numbered rows) are electrically connected to adjacent data lines at their left sides, and TFTs (e.g. the first TFTs) in the even-numbered rows (or the odd-numbered rows) are electrically connected to adjacent data lines at their right sides, thereby forming a zig-zag structure.

As shown in FIG. 2, a plurality of the first pixel units 33 are arranged in sequence to form a first pixel unit row, a plurality of the second pixel units 34 are arranged in sequence to form a second pixel unit row, and a plurality of the first pixel unit rows are arranged alternately with a plurality of the second pixel unit rows. As shown in FIG. 2, all of the pixel units in the first row are the second pixel units 34, thus the pixel units in the first row construct the second pixel unit row; all of the pixel units in the second row are the first pixel units 33, thus the pixel units in the second row construct the first pixel unit row.

It is noted that even though merely one first pixel unit row and one second pixel unit row are shown in FIG. 2, a plurality of the first pixel unit rows and a plurality of the second pixel unit rows are alternately arranged to form an arrangement of all of the pixel units in the array substrate. As such, as shown in FIG. 2, the first electrode 331c of the first TFT 331 in the first pixel unit row is electrically connected to the adjacent data line 31 at the right side of the first electrode 331c, and the first electrode 341c of the second TFT 341 in the second pixel unit row is electrically connected to the adjacent data line 31 at the left side of the first electrode 341c, therefore the array substrate as shown in FIG. 2 has the zig-zag structure.

Figure 3:
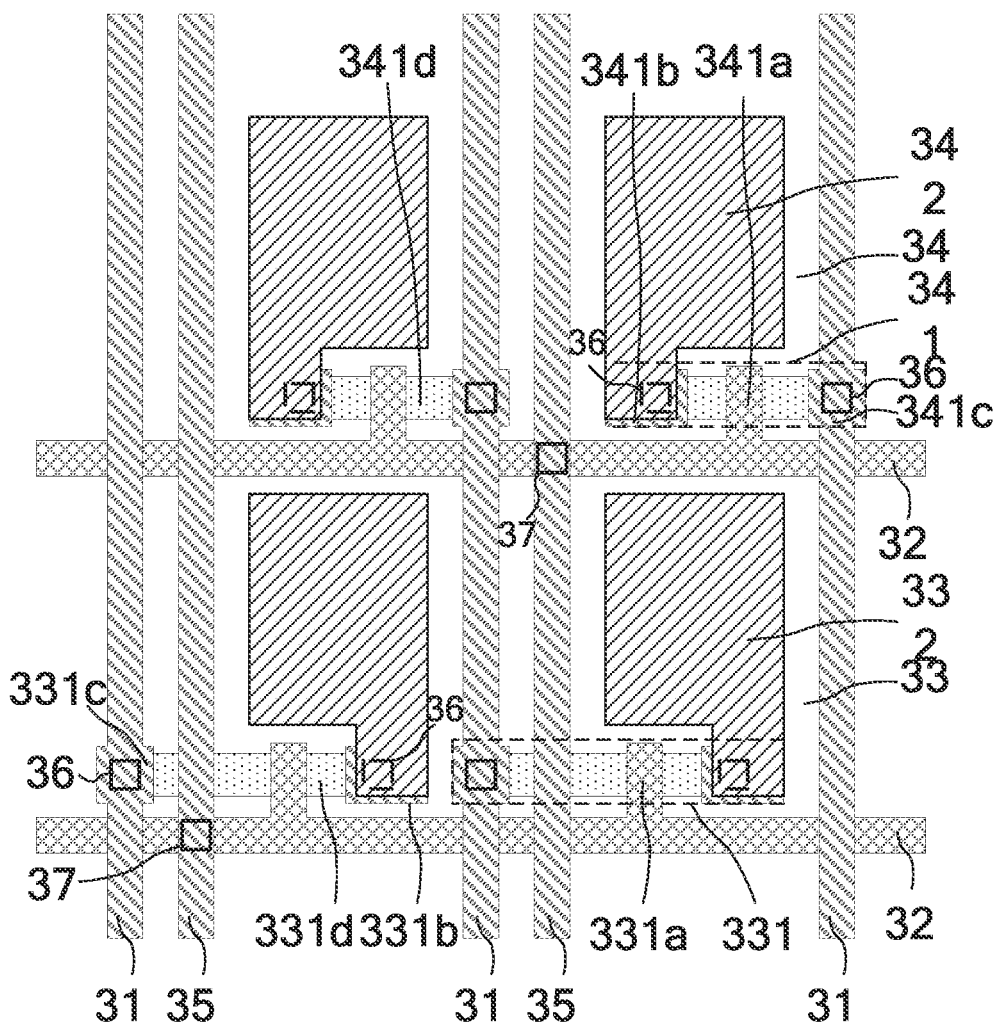
FIG. 3 is a schematic diagram showing a structure of another array substrate, according to embodiments of the disclosure.

As shown in FIG. 2, the first electrode 331c of the first TFT 331 in the first pixel unit row is electrically connected to the adjacent data line 31 at the right side of the first electrode 331c, and the first electrode 341c of the second TFT 341 in the second pixel unit row is electrically connected to the adjacent data line 31 at the left side of the first electrode 341c, which is an example for implementing the zig-zag structure. In some embodiments, as shown in FIG. 3, the first electrode 331c of the first TFT 331 in the first pixel unit row is electrically connected to the adjacent data line 31 at the left side of the first electrode 331c, the first electrode 341c of the second TFT 341 in the second pixel unit row is electrically connected to the adjacent data line 31 at the right side of the first electrode 341c.

Figure 4A:
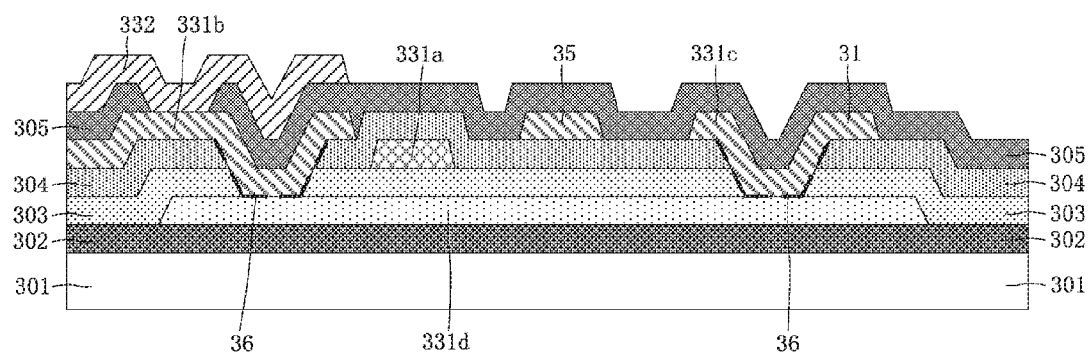
FIG. 4A is a sectional diagram taken along A1-A2 in FIG. 2.

FIG. 4A is a sectional diagram taken along A1-A2 in FIG. 2. It is noted that FIG. 4A is a sectional diagram of the array substrate taken along A1-A2 in the first TFT in FIG. 2, therefore the array substrate as shown in the FIG. 4A includes a structure of the first TFT. In regard of this, as shown in FIG. 4A, the array substrate further includes a substrate 301, a buffer layer 302, a gate insulation layer 303, an interlayer insulation layer 304 and a passivation layer 305. The buffer layer 302 is disposed on the substrate 301; the active layer 331d of the first TFT is disposed on the buffer layer 302, the gate insulation layer 303 is disposed on the active layer 331d; the gate 331a of the first TFT is disposed on the gate insulation layer 303, the interlayer insulation layer 304 is disposed on the gate 331a of the first TFT; the first electrode 331c and the second electrode 331b of the first TFT, and the data line 31 and the second gate line 35 are disposed in the same layer and above the interlayer insulation layer 304. The gate 331a and the second electrode 331b of the first TFT are disposed at one side of the second gate line 35, the first electrode 331c of the same first TFT is disposed at the other side of the second gate line 35, the first electrode 331c of the first TFT is electrically connected to the data line 31; the first electrode 331c and the second electrode 331b of the first TFT, the data line 31 and the second gate lines 35 are covered by the passivation layer 305; a first pixel electrode 332 is disposed on the passivation layer 305 and electrically connected to the second electrode 331b of the first TFT 331, where the first electrode 331c and the second electrode 331b of the first TFT are electrically connected to the active layer 331d via the first via hole 36 in the interlayer insulation layer 304 and the first via hole 36 in the gate insulation layer 303, respectively; and the first via hole 36 configured to electrically connect the first electrode 331c and the active layer 331d of the first TFT 331 and the first via hole 36 configured to electrically connect the second electrode 331b and the active layer 331d of the first TFT 331 are disposed at two opposite sides of the gate 331a of the first TFT 331, respectively.

Figure 4B:
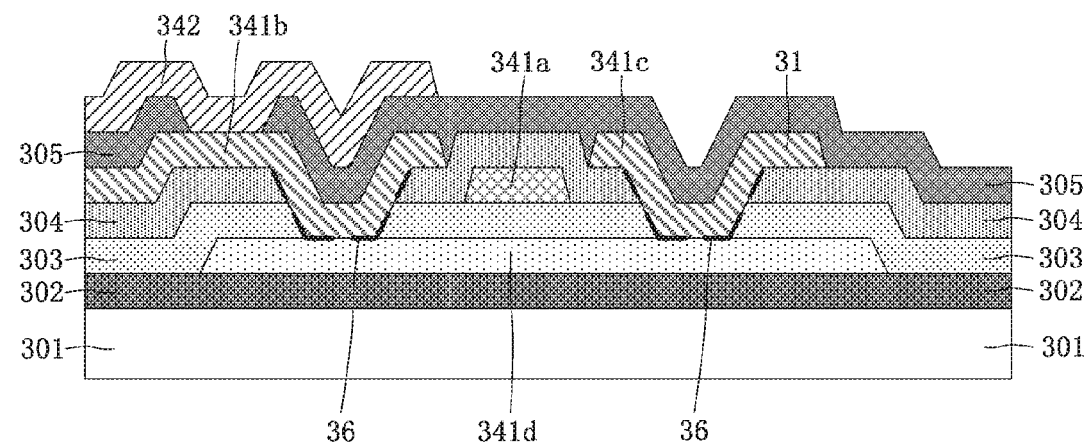
FIG. 4B is a sectional diagram taken along B1-B2 in FIG. 2.

FIG. 4B is a sectional diagram taken along B1-B2 in FIG. 2. It is noted that FIG. 4B is a sectional diagram of the array substrate taken along B1-B2 in the second TFT in FIG. 2, therefore, the array substrate as shown in the FIG. 4B includes a structure of the second TFT. In regard of this, as shown in FIG. 4B, the array substrate further includes a substrate 301, a buffer layer 302, a gate insulation layer 303, an interlayer insulation layer 304 and a passivation layer 305. The buffer layer 302 is disposed on the substrate 301; the active layer 341d of the second TFT is disposed on the buffer layer 302, the gate insulation layer 303 is disposed on the active layer 341d; the gate 341a of the second TFT is disposed on the gate insulation layer 303, the interlayer insulation layer 304 is disposed on the gate 341a of the second TFT; the first electrode 341c and the second electrode 341b of the second TFT as well as the data line 31 are disposed in the same layer on the interlayer insulation layer 304, the first electrode 341c of the second TFT is electrically connected to the data line 31; the first electrode 341c and the second electrode 341b of the second TFT and the data line 31 are covered by the passivation layer 305; a second pixel electrode 342 is disposed on the passivation layer 305 and electrically connected to the second electrode 341b of the second TFT 341, where the first electrode 341c and the second electrode 341b of the second TFT are electrically connected to the active layer 341d via the first via hole 36 in the interlayer insulation layer 304 and the first via hole 36 in the gate insulation layer 303, respectively; the first via hole 36 configured to electrically connect the first electrode 341c and the active layer 341d of the second TFT 331 and the first via hole 36 configured to electrically connect the second electrode 341b and the active layer 341d of the second TFT 331 are disposed at two opposite sides of the gate 341a of the second TFT 331, respectively.

Figure 4C:
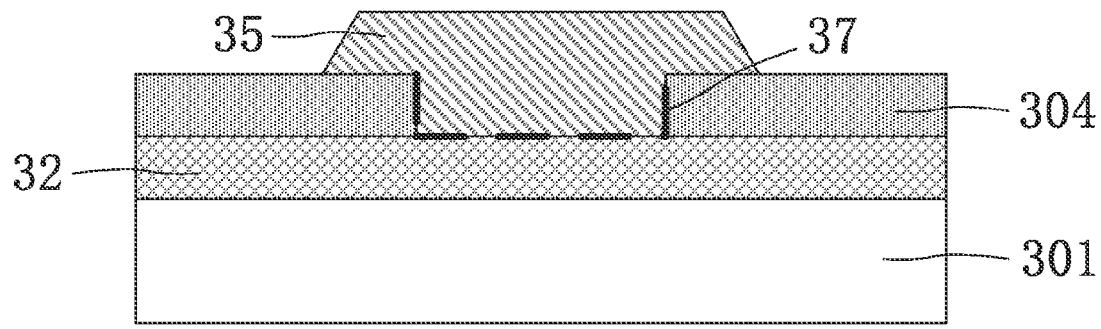
FIG. 4C is a sectional diagram taken along C1-C2 in FIG. 2.

FIG. 4C is a sectional diagram taken along C1-C2 in FIG. 2. As shown in FIG. 4C, the first gate lines 32 is disposed on the substrate 301, a second via hole 37 is disposed in the interlayer insulation layer 304 on the first gate lines 32, and the first gate line 32 is electrically connected to the second gate line 35 via the second via hole 37.

In the above embodiments, the active layer 331d of the first TFT 331 is disposed below the gate 331a of the first TFT 331 and the active layer 341d of the second TFT 341 is disposed below the gate 341a of the second TFT 341, therefore the first TFTs 331 and the second TFTs 341 are implemented in a top gate structure. In some embodiments of the disclosure, the first TFTs 331 and the second TFTs 341 may be implemented in a bottom gate structure, that is, the active layer of the first TFT is disposed above the gate of the first TFT, and likewise the active layer of the second TFT is disposed above the gate of the second TFT.

Figure 5:
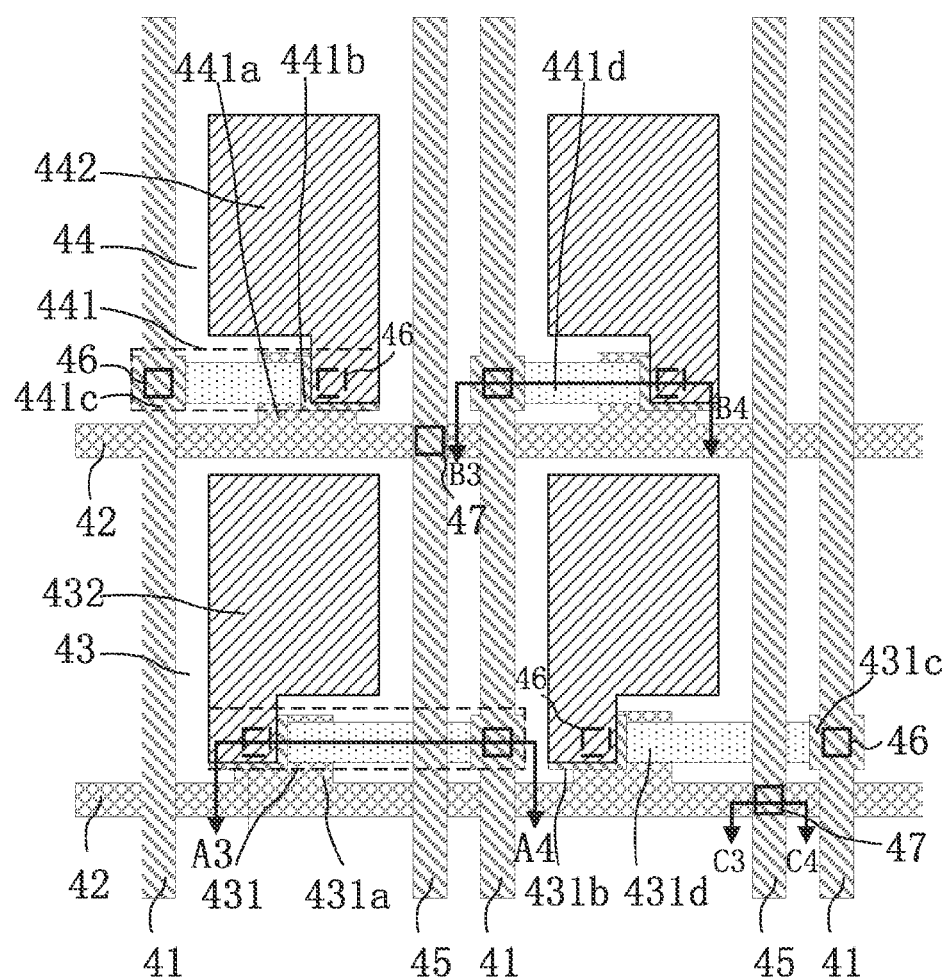
FIG. 5 is a schematic diagram showing a structure of another array substrate, according to embodiments of the disclosure.

As shown in FIG. 5, the array substrate includes: a plurality of data lines 41; a plurality of first gate lines 42; a plurality of first pixel units 43 and a plurality of second pixel units 44 formed by intersecting the plurality of data lines 41 with the plurality of first gate lines 42 which are electrically insulated from the data lines 41; and a plurality of second gate lines 45 disposed parallel to the data lines 41, where each of the second gate lines 45 is electrically connected to only one of the first gate lines 42; a first TFT 431 is disposed in each one of the first pixel units 43, and a second TFT 441 is disposed in each one of the second pixel units 44. Each one of the first TFT 431 and the second TFT 441 includes a gate (e.g. a gate 431a of the first TFT 331 and a gate 441a of the second TFT 341 as shown in FIG. 5), a second electrode (e.g. a second electrode 431b of the first TFT 431 and a second electrode 441b of the second TFT 441 as shown in FIG. 5), a first electrode (e.g. a first electrode 431c of the first TFT 431 and a first electrode 441c of the second TFT 441 as shown in FIG. 5) and an active layer (e.g. an active layer 431d of the first TFTs 431 and an active layer 441d of the second TFTs 441 as shown in FIG. 5). The second gate lines 45 and the data lines 41, as well as a metal layer in which the first electrode and the second electrode, are disposed in the same layer (as shown, elements represented by the same pattern are disposed in the same layer). The first electrode 431c of the first TFT 431 is disposed at one side of the second gate line 45, and the second electrode 431b and the gate 431a of the first TFT 431 are disposed at the other side of the second gate line 45. A projection of the second gate line 45 on the active layer is partly overlapped with the active layer 431d of the first TFT 431. The gate 441a, the first electrode 441c, the second electrode 441b and the active layer 441d of the second TFT 441 are disposed at the same side of the second gate line 45, where each one of the first electrodes of the first TFT 431 and the second TFT 441 is electrically connected to the data line 31 adjacent thereto.

As shown in FIG. 5, the second electrode 431b and first electrode 431c of the first TFT 431 are electrically connected to the active layer 431d of the first TFT 431 via third via holes 46, the second electrode 441b and the first electrode 441c of the second TFT 441 are electrically connected to the active layer 441d of the second TFT 441 via third via holes 46; the second gate lines 45 are electrically connected to the first gate lines 42 via fourth via holes 47; the second electrode 431b of each one of the first TFTs 431 is electrically connected to a first pixel electrode 432 in the same first pixel unit 43 in which the first TFT 431 is disposed; and the second electrode 441b of each one of the second TFTs 441 is electrically connected to a second pixel electrode 442 in the same second pixel unit 44 in which the second TFT 441 is disposed. As shown in FIG. 5, the active layer 431d of the first TFT 431 is disposed above the gate 431a of the first TFT 431, and the active layer 441d of the second TFT 441 is disposed below the gate 441a of the second TFT 441, therefore the first TFTs 431 and the second TFTs 441 shown in FIG. 5 are implemented in a bottom gate structure.

It is noted that an operating principle of the array substrate in FIG. 5 is the same as that of the array substrate in FIG. 2, therefore the description for implementing a zig-zag structure as shown in FIG. 5 is the same as the description for implementing a zig-zag structure as shown in FIG. 2, which is not repeated here.

Figure 6A:
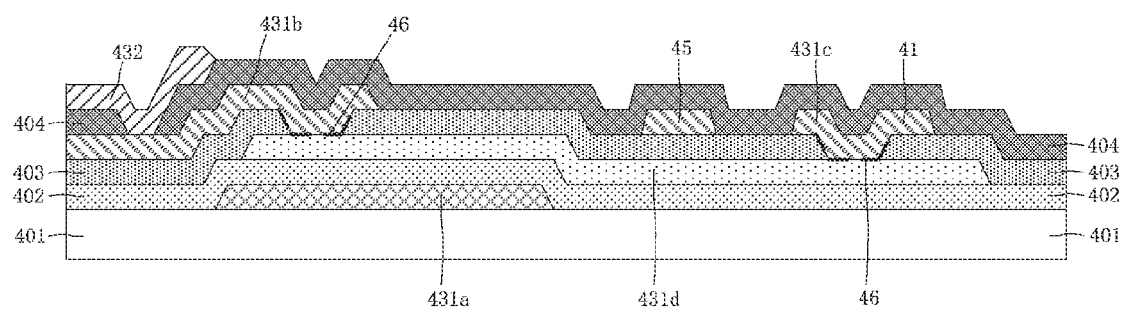
FIG. 6A is a sectional diagram taken along A3-A4 in FIG. 5.

FIG. 6A is a sectional diagram taken along A3-A4 in FIG. 5. It is noted that FIG. 6A is a sectional diagram of the array substrate taken along A3-A4 in the first TFT as shown in FIG. 5, therefore the array structure as shown in the FIG. 6A includes a structure of the first TFT. In regard of this, as shown in FIG. 6A, the array substrate further includes a substrate 401, a gate insulation layer 402, an etching barrier layer 403 and a passivation layer 404. A gate 431a of a first TFT is disposed on the array substrate 401, the gate insulation layer 402 is disposed on the gate 431a of the first TFT, an active layer 431d of the first TFT is disposed on the gate insulation layer 402, the etching barrier layer 403 is disposed on the active layer 431d, a first electrode 431c and a second electrode 431b of the first TFT, data lines 41 and second gate lines 45 are disposed in the same layer on the etching barrier layer 403, the gate 431a and the second electrode 431b of the first TFT are disposed at one side of the second gate line 45, the first electrode 431c of the same first TFT is disposed at the other side of the second gate line 45, and the first electrode 431c of the first TFT is electrically connected to the data line 41; the first electrode 431c and the second electrode 431b of the first TFT, the data line 41 and the second gate lines 45 are covered by the passivation layer 404; a first pixel electrode 432 is disposed on the passivation layer 404 and electrically connected to the second electrode 431b of the first TFT 431, where, the first electrode 431c and the second electrode 431b of the first TFT are electrically connected to the active layer 431b via the third via holes 46 in the etching barrier layer 403, respectively; and the third via hole 46 configured to electrically connect the first electrode 431c and the active layer 431d of the first TFT and the third via hole 46 configured to electrically connect the second electrode 431b and the active layer 431d of the first TFT are disposed at two opposite sides of the gate 431a of the first TFT.

Figure 6B:
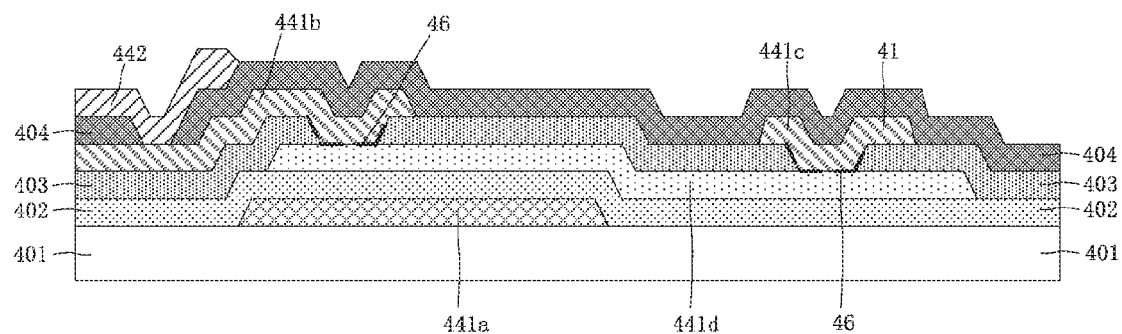
FIG. 6B is a sectional diagram taken along B3-B4 in FIG. 5.

FIG. 6B is a sectional diagram taken along B3-B4 in FIG. 5. It is that FIG. 6B is a sectional diagram of the array substrate taken along B3-B4 in the second TFT in FIG. 5, therefore, the array substrate as shown in FIG. 6B includes a structure of the second TFT. In regard of this, as shown in FIG. 6B, the array substrate further includes a substrate 401, a gate insulation layer 402, an etching barrier layer 403 and a passivation layer 404. The gate 441a of the second TFT is disposed on the array substrate 401, the gate insulation layer 402 is disposed on the gate 441a of the second TFT, the active layer 441d of the second TFT is disposed on the gate insulation layer 402, the etching barrier layer 403 is disposed on the active layer 441d; the first electrode 441c and the second electrode 441b of the second TFT and the data line 41 are disposed in the same layer on the etching barrier layer 403, the first electrode 441c of the second TFT is electrically connected to the data line 41; the first electrode 441c and the second electrode 441b of the second TFT, as well as the data line 41 are covered by the passivation layer 404; a second pixel electrode 442 is disposed on the passivation layer 404 and electrically connected to the second electrode 441b of the second TFT, where the first electrode 441c and the second electrode 441b of the second TFT are electrically connected to the active layer 441d via the third via holes 46 in the etching barrier layer 403; the third via hole 46 configured to electrically connect the first electrode 441c and the active layer 441d of the second TFT and the third via hole 46 configured to electrically connect the second electrode 441b and the active layer 441d of the second TFT are disposed at two opposite sides of the gate 441a of the second TFT, respectively.

As comparing FIG. 6A with FIG. 6B, the active layer 431d of the first TFT 431 is longer than the active layer 441d of the second TFT due to that a second gate line 45 is disposed between the gate 431a and the first electrode 431c of the first TFT 431, but there is no second gate line 35 disposed between the gate 441a and the first electrode 441c of the second TFT 441 as shown in FIG. 6B, thereby degrading electrical conductivity of the first TFT. Preferably, an overlapped area between a projection of the second gate lines 45 on the active layer 431d and the active layer 431d of the first TFTs 431 may be a doped area. If the overlapped area between the projection of the second gate lines 45 on the active layer 431d and the active layer 431d of the first TFTs 431 is doped, the electrical conductivity of the first TFT 431 can be ensured after the active layer 431d of the first TFTs 431 is lengthened.

Figure 6C:
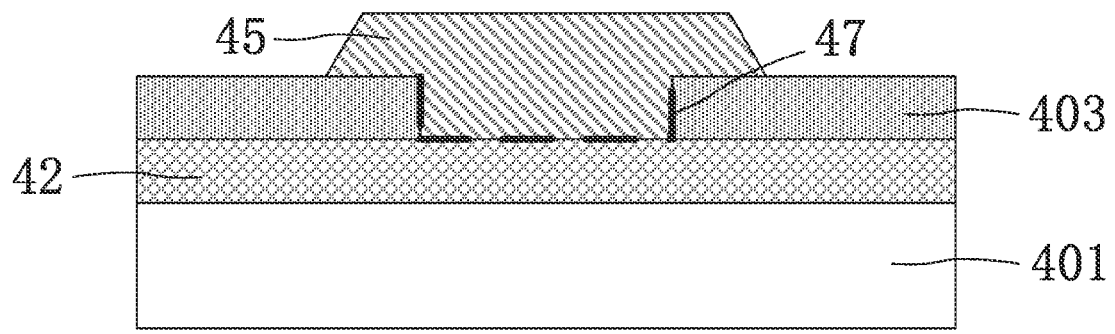
FIG. 6C is a sectional diagram taken along C3-C4 in FIG. 5.

FIG. 6C is a sectional diagram taken along C3-C4 in FIG. 5. As shown in FIG. 6C, the first gate lines 42 is disposed on the substrate 401, a fourth via hole 47 is disposed in the etching barrier layer 403 on the first gate lines 42, and the first gate line 42 is electrically connected to the second gate line 45 via the fourth via hole 47.

In embodiments of the disclosure, as shown in FIG. 2, FIG. 3 and FIG. 5, the second gate lines are arranged alternately with the data lines. In designing the array substrate, in some embodiments, the pixel units are designed to have an open area (or an aperture) of the same size, thereby ensuring quality of displaying images by the array substrate. Given that the second gate lines 35 are arranged alternately with the data lines 31, it is easy to implement the pixel units each having an open area of the same size, thereby ensuring the quality of displaying images by the array substrate.

As shown in FIG. 2, FIG. 3 or FIG. 5, the plurality of second gate lines have the same length according to embodiments of the disclosure. However, in some embodiments, the plurality of second gate lines may have different lengths. As described above, the second gate lines are configured to provide scan signals to the first gate lines electrically connected to the second gate lines. As shown in FIG. 2, if the scan signals are inputted to the second gate lines 35 from lower ends of the second gate lines 35, an effective portion of each one of second gate lines 35 (that is used to provide the scan signal to the first gate line electrically connected to the second gate line) starts from the lower end of the second gate line 35 to the second via hole 37 for electrically connecting the second gate line 35 and the first gate line 32, but the remaining portion of the second gate line 35 does not contribute to the electrical connection between the second gate line 35 and the first gate line 32, and further a capacitance is formed between the remaining portion and the data line 31 or between the remaining portion and a first gate line 32 which is not connected to the second gate line 35, thereby increasing power consumption of the array substrate, therefore, the remaining portion of the second gate line 35 in FIG. 2 may be removed, thus the lengths of the second gate lines 35 will be various, thereby reducing the power consumption of the array substrate.

In the above embodiments, the active layer may be an oxide semiconductor layer or a low temperature poly-silicon layer. If the active layer is the oxide semiconductor layer, the first TFT and the second TFT are oxide semiconductor TFTs; and if the active layer is the low temperature poly-silicon layer, the first TFT and the second TFT are low temperature poly-silicon thin film transistors (LTPS TFTs).

Figure 7:
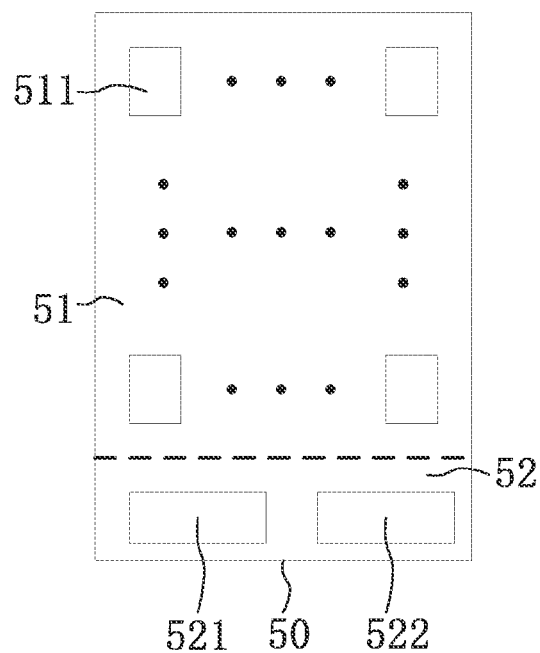
FIG. 7 is a schematic diagram showing a structure of another array substrate, according to embodiments of the disclosure.

In some embodiments of the disclosure, as shown in FIG. 7, the array substrate 50 includes a display area 51 and a step-shaped area 52 (in the bottom of FIG. 7) located at one side of the display area 51, pixel units 511 are disposed in the display area 51, and a gate drive circuit 521 and a data driving circuit 522 are disposed in the step-shaped area 52. The array substrate 50 may be the array substrate described in any one of the above embodiments, and the pixel unit 511 may be the first pixel unit or the second pixel unit. Since the gate drive circuit 521 and the data driving circuit 522 are disposed in the step-shaped area 52 of the array substrate 50, the frame area in which the gate drive circuit 521 and the data driving circuit 522 are used to be disposed may be reduced, thereby implementing the array substrate without frame.

According to some embodiments of the disclosure, a display panel is further provided. FIG. 8 is a schematic diagram showing a structure of a display panel according to embodiments of the disclosure. As shown in FIG. 8, the display panel includes an array substrate 61, a color filter substrate 62 disposed opposite to the array substrate 61, and a liquid crystal layer 63 between the array substrate 61 and the color filter substrate 62, where the liquid crystal layer 63 includes a plurality of liquid crystal molecules 631, and the array substrate 61 may be the array substrate described in the above embodiments.

It is noted that the display panel may or may not have a touch sensing function as actually desired in practical manufacture. The touch sensing function may refer to an electromagnetic touch sensing function, a capacitive touch sensing function, an electromagnetic capacitive touch sensing function or the like.

According to embodiments of the disclosure, a method for manufacturing an array substrate is further provided. FIG. 9 is a flowchart diagram of a method for manufacturing an array substrate according to embodiments of the disclosure. As shown in FIG. 9, the method for manufacturing an array substrate includes the following Steps S71 to S73.

At Step 71, a plurality of data lines and a plurality of first gate lines are formed, where a plurality of first pixel units and a plurality of second pixel units both are formed by intersecting the plurality of data lines with the plurality of first gate lines which are electrically insulated from the data lines.

At Step 72, a plurality of second gate lines disposed parallel to the data lines are formed, where the plurality of second gate lines are electrically connected to the plurality of first gate lines, respectively.

The configuration that the second gate lines are respectively electrically connecting to the first gate lines means that any one of the second gate lines is electrically connected to one first gate line, so that each second gate line is configured to provide a scan signal for one first gate line.

At Step 73, a first TFT is formed in each one of first pixel units and a second TFT is formed in each one of second pixel units, where each one of the first TFT and the second TFT includes a gate, a second electrode, a first electrode and an active layer; the second gate lines, the data lines, as well as a metal layer in which the first electrode and the second electrode are disposed, are arranged in the same layer; the first electrode of the first TFT is disposed at one side of the second gate line, and the gate and the second electrode of the first TFT are disposed at the other side of the second gate line; the second gate line is partly overlapped with the active layer of the first TFT; the gate line, the first electrode, the second electrode and the active layer of the second TFT are formed at the same side of the second gate lines, and each one of the first electrodes of the first TFT and the second TFT is electrically connected to the data line adjacent thereto.

In Step 73, the formed active layer may be an oxide semiconductor layer or a low temperature poly-silicon layer. If the active layer is the oxide semiconductor layer, the first TFT and the second TFT are oxide semiconductor TFTs; if the active layer is the low temperature poly-silicon layer, the first TFT and the second TFT are low temperature poly-silicon thin film transistors (LTPS TFTs).

It is noted that Steps 71 to 73 for manufacturing the array substrate can be adjusted as actually desired, which is not limited herein.

Furthermore, a method for manufacturing the above first TFT and the second TFT may include steps of: providing a substrate; forming a buffer layer on the substrate; forming an active layer on the buffer layer; forming a gate insulation layer on the active layer; forming a gate on the gate insulation layer; forming an interlayer insulation layer on the gate; forming a first electrode and a second electrode on the interlayer insulation layer; and forming a passivation layer on the first electrode and the second electrode.

It is noted that the various layers formed above may be manufactured by the existing technology, it is not be limited herein.

After the step of forming the interlayer insulation layer on the gate, the method for manufacturing the first TFT further includes: forming a first via hole in the interlayer insulation layer and a first via hole in the gate insulation layer, forming a second via hole in the interlayer insulation layer, where, the first via holes are formed at two opposite sides of the gate, the second via hole is formed between the first via hole and the gate; and forming the first electrode and the second electrode, on the interlayer insulation layer, around the first via holes and forming the second gate line, on the interlayer insulation layer, around the second via hole, where the first electrode and the second electrode are electrically connected to the active layer via the first via holes, respectively, and the second gate line is electrically connected to the first gate line via the second via hole.

After the step of forming the interlayer insulation layer on the gate, the method for manufacturing a second TFT further includes: forming a first via hole in the interlayer insulation layer and a first via hole in the gate insulation layer, where the first via holes are formed at two opposite sides of the gate; and forming the first electrode and the second electrode, on the interlayer insulation layer, around the first via holes, where the first electrode and the second electrode are electrically connected to the active layer via the first via holes, respectively.

The active layers of the first TFT and the second TFT manufactured by the above steps are disposed below the gates, that is, the manufactured first TFT and the second TFT have a top gate structure. The structure of the first TFT manufactured by the above steps is the same as that of the first TFT as shown in FIG. 4A, and the structure of the second TFT manufactured by the above steps is the same as that of the second TFT shown in FIG. 4B, which are not described again here.

The first TFT and the second TFT may be implemented in a bottom gate structure, instead of the top gate structure. Accordingly, a method for manufacturing the first TFT and the second TFT in the bottom gate structure includes: providing a substrate; forming a gate on the substrate; forming a gate insulation layer on the gate; forming an active layer on the gate insulation layer; forming an etching barrier layer on the active layer; forming a first electrode and a second electrode on the etching barrier layer; and forming a passivation layer on the first electrode and the second electrode.

It is noted that the various layers formed as above may be manufactured by the existing technology, which is not limited herein.

After the step of forming the etching barrier layer on the active layer, the method for manufacturing a first TFT further includes: forming third via holes and a fourth via hole in the etching barrier layer, where the third via holes are formed at two opposite sides of the gate, and the fourth via hole is formed between the third via holes and the gate; forming the first electrode and the second electrode, on the etching barrier layer, around the third via holes; and forming the second gate line, on the etching barrier layer, around the second via hole, where the first electrode and the second electrode are electrically connected to the active layer via the third via holes, respectively, and the second gate line is electrically connected to the first gate line via the fourth via hole. An area of the active layer of the first TFT, which is overlapped with a projection of the second gate line on the active layer, may be doped.

After the step of forming the etching barrier layer on the active layer, the method for manufacturing a second TFT further includes: forming third via holes in the etching barrier layer, where the third via holes are formed at two opposite sides of the gate; and forming the first electrode and the second electrode, on the interlayer insulation layer, around the third via holes, where the first electrode and the second electrode are electrically connected to the active layer via the third via holes, respectively.

The active layers of the first TFT and the second TFT manufactured by the above steps are disposed above the gate, that is, the manufactured first TFT and the second TFT have a bottom gate structure. The structure of the first TFT manufactured by the above steps is the same as that of the first TFT as shown in FIG. 6A, and the structure of the manufactured second TFT is the same as that of the second TFT as shown in FIG. 6B, which are not described again here.

According to the embodiments of the present disclosure, the array substrate and the manufacturing method thereof as well as the display panel are provided, the first TFT and the second TFT are disposed in the array substrate, where the first electrode of the first TFT is disposed at one side of the second gate line, and the gate and the second electrode of the first TFT are disposed at the other side of the second gate line; the gate, the first electrode, the second electrode and the active layer of the second TFT are disposed at the same side of the second gate line; each one of the first electrodes of the first TFT and the second TFT is electrically connected to the data line adjacent thereto; thus, if the second gate line is disposed between a TFT and a data line electrically connected to the first electrode of the TFT, the TFT may be embodied as the first TFT, as such, the first electrode of the first TFT may be electrically connected to the corresponding data line even if the second gate line and the data line, as well as the metal layer in which the first electrode and the second electrode are disposed, are arranged in the same layer; if there is no second gate line between a TFT and the data line electrically connected to the first electrode of the TFT, the TFT may be embodied as the second TFT, and the first electrode of the second TFT may be electrically connected to a corresponding data line directly, therefore the array substrate has a zig-zag structure.

It is noted that the embodiments and the technology principles of the disclosure described as above are merely illustrative. It should be understood for those skilled in the art that the disclosure is not limited to the particular embodiments described herein. Various apparent changes, readjustment and alternatives can be made by those skilled in the art without departing from the scope of the disclosure. Therefore, although the disclosure is illustrated in detail through the above embodiments, the disclosure is not merely limited to the above embodiments, and can further include other embodiments without departing from the concept of the disclosure. The scope of the disclosure is subject to the appended claims.

Various modifications and additions can be made to the exemplary embodiments discussed without departing from the scope of the disclosure. For example, while the embodiments described above refer to particular features, the scope of the disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. An array substrate comprising:
   a plurality of data lines and a plurality of first gate lines, wherein a plurality of first pixel units and a plurality of second pixel units are both formed by intersecting the plurality of data lines with the plurality of first gate lines which are electrically insulated from the data lines; and
   a plurality of second gate lines disposed parallel to the plurality of data lines, wherein the plurality of second gate lines are electrically connected to the first gate lines, respectively;
   wherein a first TFT is disposed in each one of the first pixel units, and a second TFT is disposed in each one of the second pixel units, the first TFT and the second TFT each comprise a gate, a second electrode, a first electrode and an active layer, and the second gate lines, the data lines, as well as a metal layer in which the first electrode and the second electrode are disposed, are arranged in the same layer;
   wherein the first electrode of the first TFT is disposed at one side of the second gate line, the gate and the second electrode of the first TFT are disposed at the other side of the second gate line, a projection of the second gate line on the active layer of the first TFT is partly overlapped with the active layer of the first TFT,
   the gate, the first electrode, the second electrode and the active layer of the second TFTs are disposed at the same side of the second gate line, and each one of the first electrodes of the first TFT and the second TFT is electrically connected to the adjacent data line.

2. The array substrate of claim 1, wherein the plurality of first pixel units are sequentially arranged to form first pixel unit rows, the plurality of second pixel units are sequentially arranged to form second pixel unit rows, and the first pixel unit rows are arranged alternately with the second pixel unit rows.

3. The array substrate of claim 1, wherein the array substrate comprises a display area and a step-shaped area located at one side of the display area, the pixel units are disposed in the display area, and a gate driving circuit and a data driving circuit are disposed in the step-shaped area.

4. The array substrate of claim 1, wherein lengths of the second gate lines are different.

5. The array substrate of claim 1, further comprising a substrate, a buffer layer, a gate insulation layer, an interlayer insulation layer and a passivation layer;
   wherein the buffer layer is disposed on the substrate, the active layer is disposed on the buffer layer, the gate insulation layer is disposed on the active layer, the gates are disposed on the gate insulation layer, the interlayer insulation layer is disposed on the gates, the first electrodes and the second electrodes are disposed on the interlayer insulation layer, the first electrodes and the second electrodes are covered by the passivation layer, the first electrode and the second electrode are electrically connected to the active layer via a first via hole in the interlayer insulation layer and a first via hole in the gate insulation layer, respectively.

6. The array substrate of claim 5, wherein a second via hole is disposed in the interlayer insulation layer at a position corresponding to each one of the first gate lines, and the first gate line is electrically connected to the second gate line via the second via hole.

7. The array substrate of claim 1, further comprising a substrate, a gate insulation layer, an etching barrier layer and a passivation layer;
   wherein the gate is disposed on the substrate, the gate insulation layer is disposed on the gate, the active layer is disposed on the gate insulation layer, the etching barrier layer is disposed on the active layer, the first electrodes and the second electrodes are disposed on the etching barrier layer; the first electrodes and the second electrodes are covered by the passivation layer, and the first electrode and the second electrode are electrically connected to the active layer via third via holes in the etching barrier layer, respectively.

8. The array substrate of claim 7, wherein a fourth via hole is disposed in the etching barrier layer at a position corresponding to each one of first gate lines, and the first gate line is electrically connected to the second gate line via the fourth via hole.

9. The array substrate of claim 7, wherein, an area of the active layer of the first TFT, which is overlapped with a projection of the second gate line on the active layer of the first TFT is doped.

10. The array substrate of claim 1, wherein the second gate lines are arranged alternately with the data lines.

11. The array substrate of claim 1, wherein, the active layer is an oxide semiconductor layer or a low temperature poly-silicon layer.

12. A display panel comprising the array substrate of claim 1.

13. A method for manufacturing the array substrate, wherein the method comprises:
   forming a plurality of data lines and a plurality of first gate lines, wherein a plurality of first pixel units and a plurality of second pixel units are both formed by intersecting the plurality of data lines with the plurality of first gate lines which are electrically insulated from the data lines;
   forming a plurality of second gate lines disposed parallel to the plurality of data lines, wherein the plurality of second gate lines are electrically connected to the first gate lines, respectively; and
   forming a first TFT in each one of the first pixel units, and forming a second TFT in each one of the second pixel unit, wherein the first TFT and the second TFT each comprise a gate, a second electrode, a first electrode and an active layer; the second gate lines, the data lines, as well as a metal layer in which the first electrode and the second electrode are disposed, are arranged in the same layer; the first electrode of the first TFT is disposed at one side of the second gate line, the gate and the second electrode of the first TFT are disposed at the other side of the second gate line; a projection of the second gate line on the active layer of the first TFT is partly overlapped with the active layer of the first TFT; the gate, the first electrode, the second electrode and the active layer of the second TFT are disposed at the same side of the second gate line, and each one of the first electrodes of the first TFT and the second TFT is electrically connected to the adjacent data line.

14. The method of claim 13, wherein, the forming the first TFT and the second TFT comprises:
   providing a substrate and forming a buffer layer on the substrate;
   forming an active layer on the buffer layer;
   forming a gate insulation layer on the active layer and forming the gates on the gate insulation layer;
   forming an interlayer insulation layer on the gates; forming a first electrode and a second electrode on the interlayer insulation layer; and forming a passivation layer on the first electrode and the second electrode.

15. The method of claim 14, further comprising:

forming first via holes in the interlayer insulation layer and in the gate insulation layer, and forming second via holes in the interlayer insulation layer, wherein the first electrode and the second electrode are electrically connected to the active layer via the first via holes, respectively, and the second gate lines are electrically connected to the first gate lines via the second via holes.

16. The method of claim 13, wherein, the forming the first TFT and the second TFT comprises:

providing a substrate and forming a gate on the substrate;

forming a gate insulation layer on the gate and forming the active layer on the gate insulation layer;

forming an etching barrier layer on the active layer and forming the first electrodes and the second electrodes on the etching barrier layer; and forming a passivation layer on the first electrodes and the second electrodes.

17. The method of claim 16, further comprising:

forming third via holes and fourth via holes in the etching barrier layer, wherein the first electrode and the second electrode are electrically connected to the active layer via the third via holes, respectively, and the second gate line is electrically connected to the first gate line via the fourth via hole.

18. The method of claim 16, wherein an area of the active layer of the first TFT, which is overlapped with a projection of the second gate line on the active layer of the first TFT is doped.

19. The method of claim 13, wherein the active layer is an oxide semiconductor layer or a low temperature poly-silicon layer.

\* \* \* \* \*